United States Patent [19]

Kiriseko

[11] 4,408,387
[45] Oct. 11, 1983

[54] METHOD FOR PRODUCING A BIPOLAR TRANSISTOR UTILIZING AN OXIDIZED SEMICONDUCTOR MASKING LAYER IN CONJUNCTION WITH AN ANTI-OXIDATION MASK

[75] Inventor: Tadashi Kiriseko, Kanagawa, Japan

[73] Assignee: Fujitsu Limited, Kawasaki, Japan

[21] Appl. No.: 425,648

[22] Filed: Sep. 28, 1982

[30] Foreign Application Priority Data

Sep. 28, 1981 [JP] Japan .................... 56-151986

[51] Int. Cl.³ .................... H01L 21/20; H01L 21/318
[52] U.S. Cl. .................... 29/576 E; 29/576 B; 29/578; 29/587; 148/1.5; 148/175; 148/187; 156/628; 156/653; 156/657; 357/34; 357/50; 357/54; 357/59
[58] Field of Search ............... 29/576 B, 576 E, 578, 29/587; 148/1.5, 175, 187; 156/628, 653, 657, 659.1, 662; 357/34, 50, 54, 59, 91

[56] References Cited

U.S. PATENT DOCUMENTS

| | | | |
|---|---|---|---|
| 3,507,716 | 4/1970 | Nishida et al. | 29/578 X |
| 3,710,204 | 1/1973 | Batz | 357/59 X |
| 3,909,925 | 10/1975 | Forbes et al. | 29/578 |
| 4,110,779 | 8/1978 | Rathbone et al. | 357/34 |
| 4,266,985 | 5/1981 | Ito et al. | 148/1.5 |
| 4,376,664 | 3/1983 | Hataishi et al. | 148/175 |

OTHER PUBLICATIONS

Kemlage et al., "Open Tube Diffusions", I.B.M. Tech. Discl. Bull., vol. 13, No. 4, Sep. 1970, p. 911.

*Primary Examiner*—W. G. Saba
*Attorney, Agent, or Firm*—Staas & Halsey

[57] ABSTRACT

A method for producing a bipolar transistor which has no emitter-base short and which attains a high density of integration. The method comprises the steps of forming a polycrystalline silicon layer on an anti-oxidation masking layer formed on a base region, selectively etching the polycrystalline silicon layer to form an opening, introducing impurities into the base region to form an emitter region, converting the polycrystalline silicon layer into an oxide layer whereby the size of the opening is reduced, selectively etching the anti-oxidation masking layer to form an emitter electrode opening, and forming electrodes.

16 Claims, 7 Drawing Figures

METHOD FOR PRODUCING A BIPOLAR TRANSISTOR UTILIZING AN OXIDIZED SEMICONDUCTOR MASKING LAYER IN CONJUNCTION WITH AN ANTI-OXIDATION MASK

BACKGROUND OF THE INVENTION

1. Field of the Invention

The present invention relates to a semiconductor device. More particularly, it relates to a method for producing bipolar transistors of an integrated circuit (IC).

2. Description of the Prior Art

In order to increase the density of an IC or large-scale integration circuit comprising many bipolar transistors, it is proposed to produce a bipolar transistor by a washed emitter process. According to the washed emitter process, a method for producing a bipolar transistor comprises the steps of selectively etching a silicon oxide layer formed on a base region to form an opening for defining an emitter region, forming an oxide layer containing impurities within the opening and on the silicon oxide layer, diffusing the impurities into the base region to form the emitter region, washing out the impurity-containing oxide layer, and forming an emitter electrode. The washing out of the impurity-containing oxide layer is carried out by using a suitable etching liquid (e.g., hydrofluoric acid) and by using no masking pattern. In the case of the washed emitter process, the opening for emitter diffusion serves as an emitter electrode opening, whereby there is no gap between the position of the emitter electrode opening and that of the emitter region. Accordingly, it is possible to reduce the dimensions of the emitter region to the minimum dimension for etching the silicon oxide layer. Thus, the size of the emitter region is made smaller than the conventional emitter region so that the base region and a silicon well (i.e., a silicon island) can be made smaller than conventional ones. However, although the impurities forming the emitter region diffuse in a horizontal direction during the diffusion step, a short between the emitter and base (i.e., a so-called emitter-base short) easily occurs in the bipolar transistor produced by the washed emitter process since the silicon oxide layer is simultaneously etched more or less to enlarge the opening when washing out the impurity-containing oxide layer.

SUMMARY OF THE INVENTION

An object of the present invention is to provide a method for producing a bipolar transistor without an emitter-base short.

Another object of the present invention is to provide a method for producing bipolar transistors of an IC which have a high density equal to that of a bipolar IC produced by the washed emitter process.

According to the present invention, a method for producing a bipolar transistor comprises the steps of forming a semiconductor layer on an anti-oxidation masking layer placed on a base region of a semiconductor body, selectively etching the semiconductor layer to form an opening, introducing impurities into the base region through the opening to form an emitter region, converting the semiconductor layer into an oxide layer whereby the size of the opening is reduced, selectively etching the anti-oxidation masking layer by using the oxide layer as a mask to form an emitter electrode contact opening, and forming electrodes and conductor lines.

DESCRIPTION OF THE PREFERRED EMBODIMENT

Figure 1:
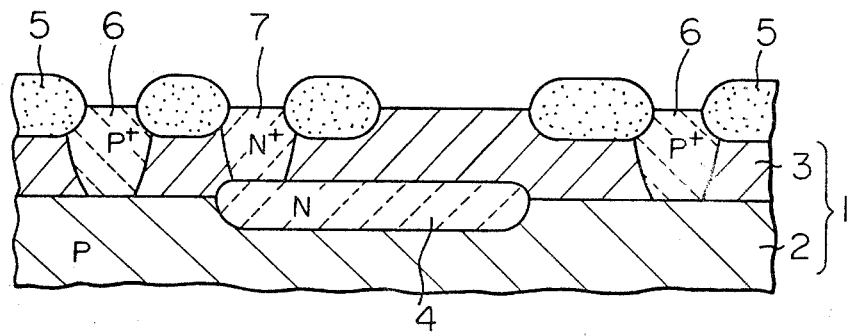
FIGS. 1 through 7 are schematic cross-sectional views of a bipolar transistor in various stages of production according to the method of the present invention.

Referring now to FIG. 1, a bipolar transistor in an intermediate stage of production is obtained by the following procedure according to a conventional process. A semiconductor body 1 comprises a single crystalline silicon (Si) semiconductor substrate 2 and an epitaxial layer 3 grown on the substrate 2. The conductivity type of the substrate 2 is, for example, P-type and that of the epitaxial layer 3 is N-type. An N+-type buried layer 4 is formed in a usual manner in the substrate 2 and the epitaxial layer 3, for example, by locally introducing N-type impurities, prior to epitaxial growth, into the substrate 2 and by diffusing the impurities, during epitaxial growth, into the substrate 2 and into the epitaxial layer 3. An anti-oxidation layer (not shown) comprising, e.g., silicon nitride ($Si_3N_4$) is formed on the epitaxial layer 3 of the semiconductor body 1 by a chemical vapor deposition process and then is selectively etched by a photoetching process. The epitaxial layer 3 is selectively oxidized to form a thick oxide layer 5 of silicon dioxide ($SiO_2$) by a thermal oxidation process. A first photoresist pattern (not shown) is formed on the exposed surface, except for the surface of an area for providing the isolation region of the epitaxial layer 3. P-type impurities (e.g., boron) are introduced into the epitaxial layer 3 through the anti-oxidation masking layer by an ion-implantation process by using the first photoresist pattern as a mask so that an isolation region 6 is formed. For example, a boron ion dose of $3 \times 10^{15}$ atoms/cm$^2$ at an energy of 60 keV is used. Then a second photoresist pattern (not shown) is formed on the exposed surface, except for the surface of an area for providing a collector contact region. N-type impurities (e.g., phosphorus) are also introduced into the epitaxial layer 3 through the anti-oxidation masking layer by an ion-implantation process by using the second photoresist pattern as a mask so that a collector contact region 7 is formed. For example, a phosphorus ion dose of $2 \times 10^{15}$ atoms/cm$^2$ at an energy of 120 keV is used. Then, the semiconductor body 1 is heated (i.e. annealed) at a temperature of e.g. 1150° C. for 40 minutes under a dry nitrogen ($N_2$) atmosphere so as to activate the P-type isolation region 6 and the N-type collector region 7. The anti-oxidation masking layer is removed with a suitable etchant as illustrated in FIG. 1.

Figure 2:
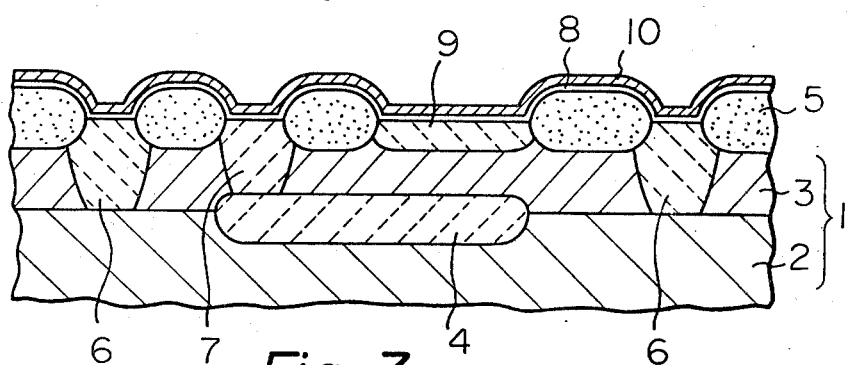

According to the present invention, another anti-oxidation masking layer 8 is formed on at least the area for providing the base region. It is preferable to form an anti-oxidation masking layer 8 (having a thickness of, e.g., 50 nm) on the exposed surface (i.e., on the thick oxide layer 5, the isolation region 6, the collector contact region 7, and the area for providing the base region) by the chemical vapor deposition of silicon nitride, as illustrated in FIG. 2. It is possible to form the anti-oxidation masking layer (having a thickness of, e.g., 10 nm) by thermally nitriding the exposed surface of the epitaxial layer 3 (i.e., the surfaces of the isolation region 6, the collector contact region 7, and the area for providing the base region). In this case, the thick oxide layer 5 is not coated with the masking layer. A third photoresist layer (not shown) is then formed on the exposed surface, except for the surface of the area for providing the base region. P-type impurities (e.g., boron) are introduced into the epitaxial layer 3 through the anti-oxidation masking layer 8 by an ion-implantation process by using the third photoresist pattern as a mask so that a base region 9 is formed, as illustrated in FIG. 2. For example, a boron ion dose of $6 \times 10^{13}$ atoms/cm$^2$ at an energy of 40 keV is used. The semiconductor body 1 is heated (i.e. annealed) at 900° C. for 30 minutes under a dry nitrogen (N$_2$) atmosphere so as to activate the P-type base region 9. It is possible to form the base region 9 prior to the formation of the anti-oxidation masking layer 8. Then a semiconductor layer 10 of polycrystalline silicon (having a thickness of, e.g., 150 nm) is formed on the anti-oxidation masking layer 8 by a chemical vapor deposition process, as illustrated in FIG. 2.

Figure 3:
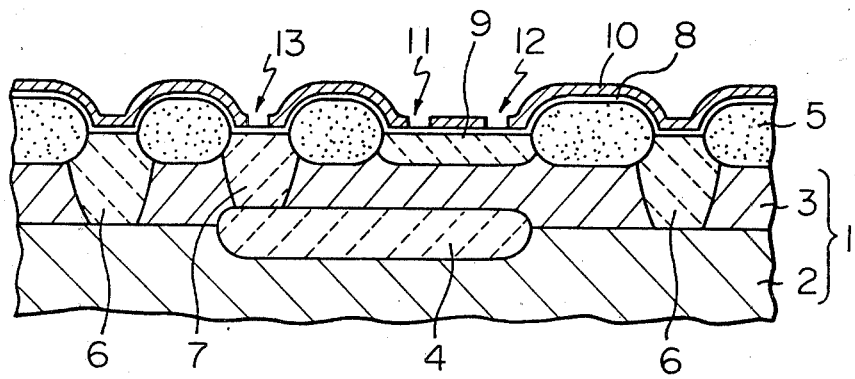

The polycrystalline silicon layer 10 is selectively etched by a photo etching process to form a first opening 11 for defining an emitter region, a second opening 12 for a base electrode, and a third opening 13 for a collector electrode, as illustrated in FIG. 3.

Figure 4:
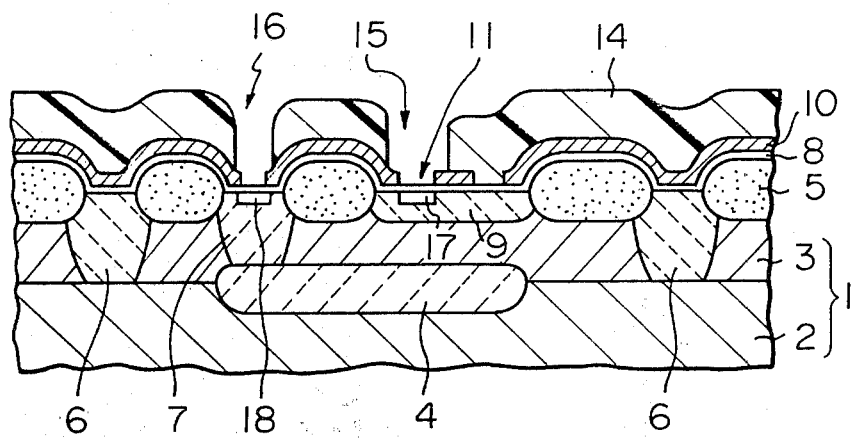

A photoresist layer 14 is coated on the exposed surface (i.e., on the polycrystalline silicon layer 10 and within the openings 11, 12, and 13) and is selectively removed to form an opening 15 above the first opening 11, and an opening 16 above the third opening 13 as illustrated in FIG. 4. N-type impurities (donor, e.g., arsenic (As) or phosphorus (P) are introduced into the base region 9 through the opening 15, the first opening 11, and the anti-oxidation masking layer 8 by an ion-implantation process to form the emitter region 17. Simultaneously a highly doped collector contact region 18 is formed in the region 7 by the ion-implantation process. The impurity ions may be implanted by using 60 keV with an ion density of $5 \times 10^{15}$ atoms/cm$^2$ dose. Since the photoresist layer 14 and the polycrystalline silicon layer 10 serve as a mask, the impurities cannot be introduced into the epitaxial layer 3, except for the emitter region 17 and the highly doped region 18.

Figure 5:
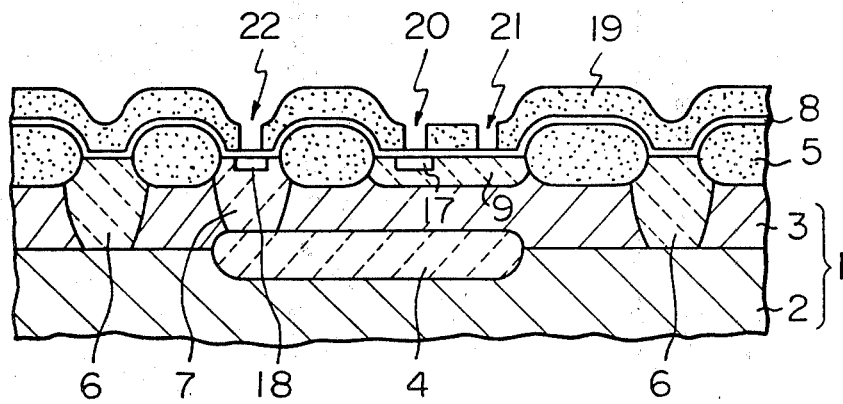

After removing the photoresist layer 14, the polycrystalline silicon layer 10 is converted into an oxide layer 19, as illustrated in FIG. 5. Practically, the polycrystalline silicon layer 10 is thermally oxidized to form the oxide layer 19 of silicon dioxide by a conventional thermal oxidation process (e.g., at 1000° C. for about 50 minutes). When polycrystalline silicon is converted into silicon dioxide, the volume is increased approximately twofold so that the silicon dioxide layer 19 has a thickness of about 340 nm. Due to such an increase of the volume, the size of the openings 11, 12, and 13 in the polycrystalline silicon layer 10 is reduced to the size of the openings 20, 21, and 22 in the oxide layer 19, respectively. Furthermore, during thermal oxidation, the impurities for the emitter region diffuse more or less in a horizontal direction so that the emitter region 17 enlarges. Therefore, the size of the opening 20 is smaller than the size of the emitter region 17.

Figure 6:
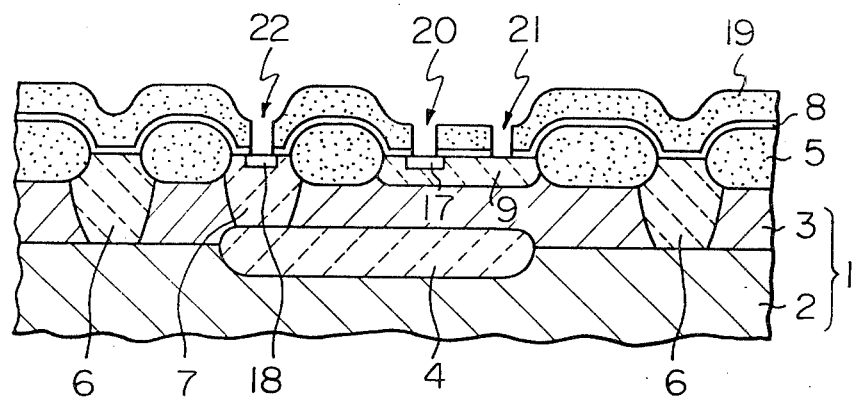

The anti-oxidation masking layer 8 is selectively etched with a suitable etchant by using the oxide layer 19 as a mask. Namely, the portions of the masking layer 8 exposed in the openings 20, 21, and 22 are removed to expose portions of the emitter region 17, the base region 8, and the highly coped collector contact region 18, as illustrated in FIG. 6. Thus, the openings 20, 21, and 22 can serve as an emitter electrode opening, a base electrode opening, and a collector electrode opening, respectively.

Figure 7:
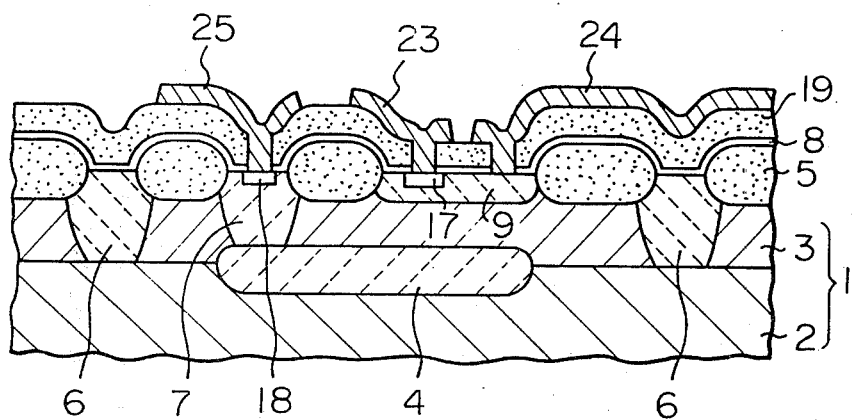

Then a conductor layer of, e.g., aluminum is formed on the exposed surface by vacuum evaporation and is selectively etched by a photoetching process to form an emitter electrode 23, a base electrode 24, and a collector electrode 25, as illustrated in FIG. 7. Predetermined conductor lines (not shown) for connecting elements to a circuit are simultaneously formed. It is possible to additionally form a platinum layer (having a thickness of, e.g., 100 nm) on the oxide layer 19 and on the exposed portions of the regions 17, 9, and 18 by a vacuum evaporation process. The platinum layer reacts with the silicon of the exposed portions to form a platinum silicide layer, as a result of being subjected to a heat treatment, prior to the formation of the aluminum layer. The platinum silicide can improve the stability of a forward voltage of a Schottky barrier diode. After the formation of the electrodes 23, 24, and 25, the platinum layer on the oxide layer 19 is removed with aqua regia by using the electrodes as a mask.

According to the present invention, it is possible to form by self-alignment the emitter electrode opening 20 having smaller dimensions than those of the opening 11 for ion-implantation of the emitter region 17. Therefore, a so-called emitter-base short cannot occur.

It will be obvious that the present invention is not restricted to the above-mentioned embodiments and that many variations are possible for a person having ordinary skill in the art without departing from the scope of the present invention. For example, it is possible to produce a PNP-type bipolar transistor instead of the above-mentioned NPN-type bipolar transistor, and the anti-oxidation masking layer may be made of silicon carbide instead of silicon nitride. It is preferable to apply the method according to the present invention to production of an IC comprising bipolar transistors and Schottky barrier diodes. In this case, it is possible to easily form an opening for an electrode of a Schottky diode as compared with a conventional production method including the washed emitter process.

I claim:

1. A method for producing a bipolar transistor having a silicon semiconductor substrate and an epitaxial layer formed on the silicon substrate, comprising the steps of:
   (a) forming a base region in the epitaxial layer;
   (b) forming an anti-oxidation masking layer on the base region;
   (c) forming a semiconductor layer on the anti-oxidation masking layer;
   (d) selectively etching the semiconductor layer to form a first opening for defining an emitter region and a second opening for defining a base electrode;
   (e) introducing impurities into the base region through the first opening to form the emitter region;
   (f) converting the semiconductor layer into an oxide layer;
   (g) selectively etching the anti-oxidation masking layer by using the oxide layer as a mask to expose portions of the emitter region and the base region; and
   (b) forming electrodes and conductor lines on the exposed emitter and base regions.

2. A method according to claim 1, wherein the semiconductor substrate and the epitaxial layer thereon form a semiconductor body.

3. A method according to claim 1, wherein said step (c) comprises forming the semiconductor layer comprising polycrystalline silicon.

4. A method according to claim 1, wherein said step (b) comprises forming the anti-oxidation masking layer of silicon nitride.

5. A method according to claim 4, wherein said forming of said silicon nitride layer is carried out by a chemical vapor deposition process.

6. A method according to claim 4, wherein said forming of said silicon nitride layer is carried out by thermally nitriding the surface of the base region.

7. A method according to claim 1, wherein said converting step (f) comprises thermally oxidizing the semiconductor layer to form the oxide layer.

8. A method according to claim 7, wherein said converting step (f) comprises forming the oxide layer of silicon dioxide.

9. A method for producing a bipolar transistor having a semiconductor substrate, a base region formed in the semiconductor substrate and an anti-oxidation masking layer formed on the base region, comprising the steps of:
a. forming a semiconductor layer on the anti-oxidation masking layer;
b. selectively etching the semiconductor layer to form a first opening for defining an emitter region and a second opening for defining a base electrode;
c. introducing impurities into the base region through the first opening to form the emitter region;
d. converting the semiconductor layer into an oxide layer;
e. selectively etching the anti-oxidation masking layer by using the oxide layer as a mask to expose portions of the emitter region and the base region; and
f. forming electrodes and conductor lines on the exposed emitter and base regions.

10. A method according to claim 9, wherein an epitaxial layer is formed on the semiconductor substrate and the base region is formed in the epitaxial layer and the resulting structure together with the anti-oxidation masking layer form a semiconductor body.

11. A method according to claim 9, whrein said step (a) comprises forming the semiconductor layer comprising polycrystalline silicon.

12. A method according to claim 9, wherein the anti-oxidation masking layer comprises silicon nitride.

13. A method according to claim 12 wherein the silicon nitride layer is formed by a chemical vapor deposition process.

14. A method according to claim 12 wherein the silicon nitride layer is formed by thermally nitriding the surface of the base region.

15. A method according to claim 9, wherein said converting step (d) comprises thermally oxidizing the semiconductor layer to form the oxide layer.

16. A method according to claim 15 wherein said converting step (d) comprises forming the oxide layer of silicon dioxide.

* * * * *

UNITED STATES PATENT AND TRADEMARK OFFICE
CERTIFICATE OF CORRECTION

PATENT NO. : 4,408,387
DATED : OCTOBER 11, 1983
INVENTOR(S) : TADASHI KIRISEKO

It is certified that error appears in the above-identified patent and that said Letters Patent is hereby corrected as shown below:

Col. 2, line 13, "procedurea  ccording" should be --procedure according--.

Col. 3, line 21, "photo etching" should be --photo-etching--;
       line 31, "(P)" should be --(P))--;
       line 66, "coped" should be --doped--.

Col. 6, line 13, "whrein" should be --wherein--;
       line 18, after "12" insert --,--;
       line 21, after "12" insert --,--;
       line 27, after "15" insert --,--.

Signed and Sealed this

Ninth Day of April 1985

[SEAL]

Attest:

DONALD J. QUIGG

Attesting Officer    Acting Commissioner of Patents and Trademarks